United States Patent
Werner et al.

(10) Patent No.: US 11,890,651 B2
(45) Date of Patent: Feb. 6, 2024

(54) VENTING DEVICE WITH SPLASH GUARD AND POWER TOOL WITH SUCH A VENTING DEVICE

(71) Applicant: Andreas Stihl AG & Co. KG, Waiblingen (DE)

(72) Inventors: Philipp Werner, Waiblingen (DE); Jens Knauß, Remshalden (DE); Yannik Baumhackl, Kirchberg an der Murr (DE); David Beck, Winnenden (DE)

(73) Assignee: Andreas Stihl AG & Co. KG, Waiblingen (DE)

( * ) Notice: Subject to any disclaimer, the term of this patent is extended or adjusted under 35 U.S.C. 154(b) by 505 days.

(21) Appl. No.: 17/073,366

(22) Filed: Oct. 18, 2020

(65) Prior Publication Data
US 2021/0121923 A1 Apr. 29, 2021

(30) Foreign Application Priority Data
Oct. 24, 2019 (EP) ..................................... 19205170

(51) Int. Cl.
*B08B 13/00* (2006.01)
*B08B 3/02* (2006.01)
(Continued)

(52) U.S. Cl.
CPC .............. *B08B 13/00* (2013.01); *B05B 12/32* (2018.02); *B05B 15/14* (2018.02); *B08B 3/026* (2013.01);
(Continued)

(58) Field of Classification Search
CPC ..... B08B 13/00; B08B 3/026; B08B 2203/02; B08B 2203/0264; B05B 12/32;
(Continued)

(56) References Cited

U.S. PATENT DOCUMENTS 3,358,580 A * 12/1967 Freese ..................... F24F 13/08
55/440
4,452,024 A * 6/1984 Sterriker ................. E06B 7/082
52/473
(Continued)

FOREIGN PATENT DOCUMENTS

CN 201 533 475 7/2010
DE 10 2005 048 092 4/2007
(Continued)

*Primary Examiner* — Steven B McAllister
*Assistant Examiner* — Charles R Brawner
(74) *Attorney, Agent, or Firm* — Gudrun E. Huckett (57) ABSTRACT

A venting device with a splash guard for deflection of splashing water entering the interior of the venting device has slats with a front section arranged at the exterior. Venting slots are formed between the front sections. At least one of the slats has a deflection section arranged at the interior and a central section connecting deflection section and front section. The front section and the deflection section are angled relative to the central section. The front section of the at least one slat in the operating position of the venting device extends from the central section toward the top side. The deflection section extends in the operating position from the central section toward the bottom side. The deflection section has a region oriented at an angle of less than 90° relative to the central section. A power tool with such a venting device is provided.

19 Claims, 6 Drawing Sheets

(51) Int. Cl.
  *B05B 12/32* (2018.01)
  *F24F 7/00* (2021.01)
  *F24F 13/08* (2006.01)
  *B05B 15/14* (2018.01)
  *H05K 5/02* (2006.01)
  *H05K 7/20* (2006.01)

(52) U.S. Cl.
  CPC ............... *F24F 7/00* (2013.01); *F24F 13/08* (2013.01); *H05K 5/0213* (2013.01); *H05K 7/20* (2013.01); *H05K 7/2089* (2013.01)

(58) Field of Classification Search
  CPC .. B05B 15/14; F24F 7/00; F24F 13/08; H05K 5/0214; H05K 5/0212; H05K 5/02; H05K 7/20; H05K 7/2089; A01B 43/00; A01C 7/00
  USPC ........................................................ 454/184
  See application file for complete search history.

(56) References Cited

U.S. PATENT DOCUMENTS

| | | | |
|---|---|---|---|
| 10,173,161 B2 | 1/2019 | Pfannenberg | |
| 2004/0087266 A1* | 5/2004 | Cigelske, Jr. | H05K 5/0213 454/277 |
| 2007/0076356 A1 | 4/2007 | Chiang | |
| 2007/0207043 A1* | 9/2007 | Hahn | F04B 17/06 417/364 |
| 2007/0275652 A1* | 11/2007 | Berkompas | F24F 13/082 454/277 |
| 2008/0014858 A1 | 1/2008 | Pfannenberg | |
| 2008/0045135 A1 | 2/2008 | Pfannenberg | |
| 2008/0128032 A1* | 6/2008 | Lapetina | B08B 3/026 122/13.3 |
| 2009/0045271 A1* | 2/2009 | Alexander | B08B 3/026 239/722 |
| 2009/0173753 A1* | 7/2009 | Conner | B05B 9/007 222/538 |
| 2011/0005177 A1 | 1/2011 | Pfannenberg | |
| 2012/0015596 A1* | 1/2012 | Fang | E06B 7/082 49/31 |
| 2012/0024594 A1 | 2/2012 | Guan | |
| 2012/0318472 A1 | 12/2012 | Caspar | |
| 2013/0035032 A1 | 2/2013 | Schneider et al. | |
| 2014/0374046 A1 | 12/2014 | Caspar | |
| 2016/0105995 A1 | 4/2016 | Falk | |
| 2018/0228331 A1 | 8/2018 | Moser et al. | |

FOREIGN PATENT DOCUMENTS

| | | |
|---|---|---|
| DE | 10 2006 023 236 | 11/2007 |
| DE | 20 2012 100 563 | 5/2012 |
| DE | 10 2016 009 698 | 4/2017 |
| EP | 2 152 052 | 2/2010 |
| FR | 3 036 249 | 11/2016 |
| WO | 97/23308 | 7/1997 |
| WO | 2005/028131 | 3/2005 |
| WO | 2009/124710 | 10/2009 |
| WO | 2013/123968 | 8/2013 |
| WO | 2015/127989 | 9/2015 |
| WO | 2017/137620 | 8/2017 |

* cited by examiner

VENTING DEVICE WITH SPLASH GUARD AND POWER TOOL WITH SUCH A VENTING DEVICE

BACKGROUND OF THE INVENTION

The invention relates to a venting device with splash guard for at least partial deflection of splashing water advancing from an exterior of the venting device in the direction toward an interior of the venting device, wherein the venting device comprises a plurality of adjacently positioned slats, wherein each slat is provided at the exterior with a front section, wherein venting slots are formed between the front sections. At least one slat comprises a deflection section at the interior, wherein the deflection section is connected by a central section with the front section, wherein the front section is angled relative to the central section, and wherein the deflection section is angled relative to the central section. In an operating position, the venting device comprises a top side and a bottom side in respect to the vertical direction, wherein the front section in the operating position extends from the central section in the direction toward the top side, and wherein the deflection section in the operating position extends from the central section in the direction toward the bottom side.

The invention further relates to a power tool with such a venting device.

Such venting devices are typically produced from plastic material. In this context, it is advantageous when the venting device is configured without undercuts in regard to removal from the mold (demolding). It is then possible to demold (remove from the mold) the venting device in a simple way. Venting slots of such a venting device extend transversely to the demolding direction. The venting device comprises an interior and an exterior. In order to be able to divert splashing water that is at least partially advancing from the exterior, the venting device has a deflection section that extends transversely to the demolding direction. In a viewing direction corresponding to the demolding direction, the deflection section covers a correlated venting slot. Venting slot and deflection section are arranged at a distance from each other in the demolding direction. In operation of the venting device, which is typically used in high-pressure washers, a large quantity of splashing water can still penetrate into the interior of the venting device.

The invention has the object to further develop a venting device of the aforementioned kind in such a way that a large quantity of splashing water is prevented from penetrating into the interior of the venting device.

A further object of the invention resides in providing a power tool with a venting device in which the venting device is designed such that a large quantity of splashing water is prevented from penetrating into the interior of the venting device.

SUMMARY OF THE INVENTION

In accordance with the invention, this is achieved in regard to the venting device in that the deflection section comprises a region that, relative to the central section, is oriented at an angle of less than 90°.

In accordance with the invention, the object is achieved in regard to the power tool in that the deflection section comprises a region that, relative to the central section, is oriented at an angle of less than 90°, wherein the power tool can be positioned for its use in a position of use on a flat ground, and wherein the venting device, in the position of use of the power tool, is in the operating position.

The invention provides that the deflection section comprises a region that, relative to the central section, is oriented at an angle of less than 90°. The invention is based on the findings that a significant portion of splashing water bounces off the deflection section and is thrown back. In this context, a kind of reflection of the splashing water at the deflection section takes place. In case of this reflection of the splashing water, it holds true that the emergent angle of the splashing water relative to a tangential plane of the deflection section corresponds to the incident angle relative to this plane. Due to the orientation of the region of the deflection section at an angle of less than 90° relative to the central section, splashing water which is impinging on the deflection section is thrown back with a greater probability in the direction toward the central section than in the direction away from the central section. This has the result that a large partial quantity of the splashing water which is penetrating through a venting slot will also exit the venting device through this venting slot. In this way, the quantity of the splashing water which is penetrating into the interior of the venting device can be reduced.

Advantageously, the region of the deflection section and the central section are oriented at an angle of less than 60° relative to each other.

Expediently, the deflection section overlaps at least partially a correlated venting slot in the viewing direction from the exterior to the interior. It can also be provided that the deflection section completely overlaps the venting slot. Expediently, the viewing direction corresponds to a demolding direction in which the shaped parts are demolded when manufacturing the venting device from plastic material. Due to the overlap of the deflection section and of the correlated venting slot, splashing water that enters in the viewing direction or the demolding direction impinges on the deflection section.

The central section and the deflection section have a common surface which is facing the exterior. In an advantageous embodiment of the invention, it is provided that the common surface is concavely shaped in a cross section perpendicular to the longitudinal direction of the at least one slat. The longitudinal direction of the at least one slat extends transversely, in particular perpendicularly, to the demolding direction. Due to the concave shape of the common surface, splashing water that is impinging at a low speed on the central section can be guided along the concave surface and thereby be subjected to a directional change in the direction toward the venting slot.

Expediently, the common surface in cross section perpendicular to the longitudinal direction of the at least one slat follows in sections thereof a circular arc line.

Expediently, the front sections are positioned in a common plane. In an advantageous further embodiment of the invention, it is provided that the plane in the operating position of the venting device is oriented at an angle from 30° to 60° relative to a flat ground. In this way, the venting device can be positioned at a minimal distance from the ground and can still be tilted.

Expediently, the central section in the operating position of the venting device extends transversely to the vertical direction, in particular perpendicular to the vertical direction.

Advantageously, a plurality of slats with a central section and a deflection section are provided.

In an advantageous further embodiment of the invention, it is provided that at least one deflection section is shaped and arranged such that in the operating position water can drip from an outer surface of the deflection section that is facing the exterior onto the central section of the neighboring slat. In particular, the plurality of slats are arranged in a stair-like arrangement. Expediently, the at least one deflection section at the interior is shaped such that in the operating position water can drip from an inner surface of the deflection section that is facing an interior onto the neighboring slat. In this way, splashing water that has penetrated into the interior of the venting device can drip from a slat onto the neighboring slat arranged underneath. In this manner, the water can collect at a low point of the venting device. This point can be arranged at a location at which the splashing water does not cause harm. Also, it can be provided that splashing water that has penetrated into the interior can be discharged from this point to the exterior of the venting device.

Expediently, the central sections of the plurality of slats in the operating position are positioned in the vertical direction at least in sections thereof adjacent to each other, in particular in sections thereof parallel adjacent to each other. In this way, the slats can be produced in a particularly simple manner. In particular, a simple demolding action is possible for a venting device made of plastic material.

Expediently, the plurality of slats have the same shape.

The plurality of slats comprise a first slat and a second slat. The central section of the first slat comprises a first surface facing the exterior of the venting device. The central section of the second slat comprises a second surface facing the exterior of the venting device. The second surface is positioned at a first distance from the first surface. Advantageously, at least the front section of the second slat extends across a front region amounting to at least 30%, in particular at least 40%, of the first distance.

In particular, the plurality of slats comprise a third slat. In particular, the second surface of the central section of the second slat is positioned at a second distance from a third surface of a central section of the third slat. Advantageously, at least the deflection section of the second slat extends across a deflection region amounting to at least 30%, in particular at least 40%, of the second distance.

The power tool according to the invention can be positioned for use in a position of use on a flat ground. The venting device in the position of use of the power tool is in the operating position. In particular, it is provided that the power tool is a high-pressure washer.

The power tool comprises, in respect to the ground, a top end and a bottom end. Advantageously, the venting device is arranged at the bottom end of the power tool. In such an arrangement of the venting device, the orientation of the central section and of the deflection section is particularly advantageous. In this way, it can be prevented that splashing water can penetrate into the region above the venting device.

In an advantageous further embodiment of the invention, it is provided that the power tool comprises a housing with a housing wall, that the venting device is part of the housing wall, that the housing interior of the housing is arranged at the interior of the venting device, that the exterior of the venting device is positioned outside of the housing, and that the power tool through the venting device sucks in air from the exterior to the interior.

In particular, the power tool comprises at least one electrically operated component. Expediently, the venting device in the position of use is arranged at least partially below all electrically operated components. In this way, all electrically operated components are positioned above the venting device and are protected by the splash guard of the venting device from splashing water.

BRIEF DESCRIPTION OF THE DRAWING

An embodiment of the invention will be explained in the following with the aid of the drawing.

DESCRIPTION OF THE PREFERRED EMBODIMENTS

Figure 1:
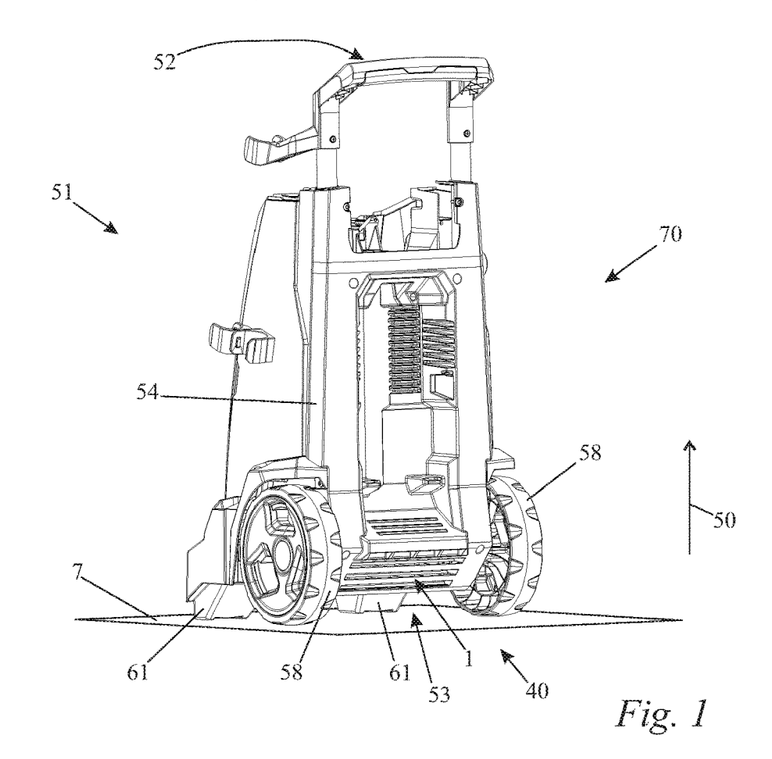
FIG. 1 is a perspective illustration of a high-pressure washer.
Figure 2:
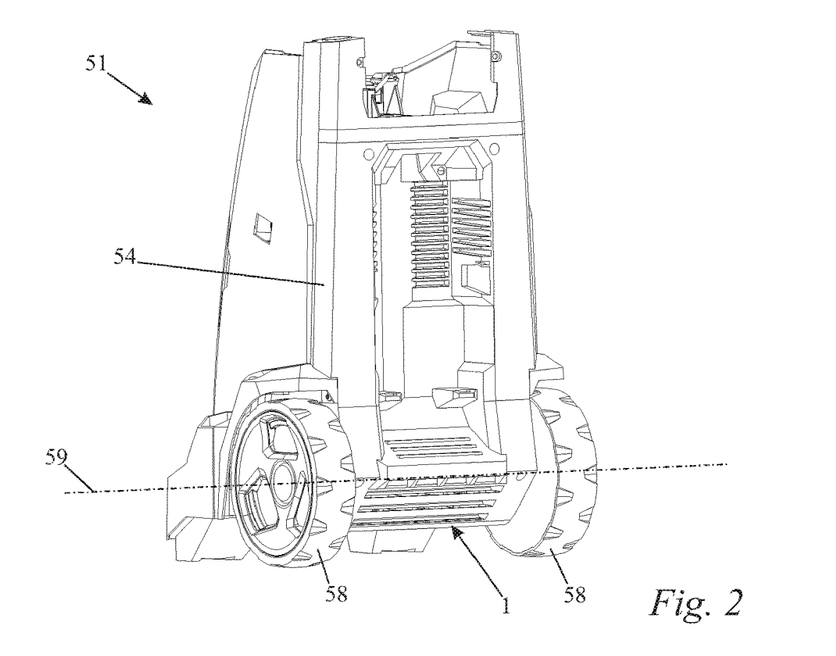
FIG. 2 is a perspective illustration of a portion of the high-pressure washer of FIG. 1.

FIGS. 1 and 2 show the power tool 51. The power tool 51 is a high-pressure washer. It can also be provided that the power tool is a spraying device, a lawn mower, a robot lawn mower, or a sweeper.

As illustrated in FIG. 1, the power tool 51 can be positioned for use in a position of use 70 on a flat ground 7. The power tool 51 has, in respect to the ground 7, a top end 52 and a bottom end 53. The top end 52 and the bottom end 53 are the longitudinal ends of the power tool 51. The power tool 51 comprises a venting device 1. The venting device 1 is arranged at the bottom end 53 of the power tool 51. The power tool 51 comprises two wheels 58. The two wheels 58 are rotatable about a common rotation axis 59. The wheels 58 are supported at a housing 54 of the power tool 51. The power tool 51 comprises two support legs 61. The support legs 61 are connected to the housing 54. In the position of use 70 of the power tool 51, the power tool 51 is supported by the wheels 58 and the support legs 61 on the ground 7. The ground 7 is flat and extends in a horizontal plane.

In the position of use 70 of the power tool 1, the venting device 51 is arranged in an operating position 40.

Figure 3:
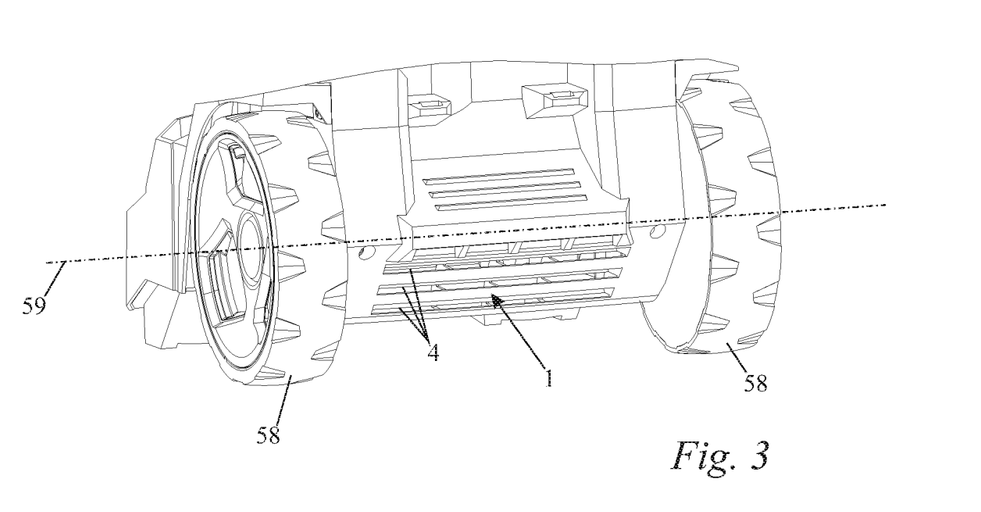
FIG. 3 is a perspective illustration of a portion of the high-pressure washer according to FIG. 1.
Figure 4:
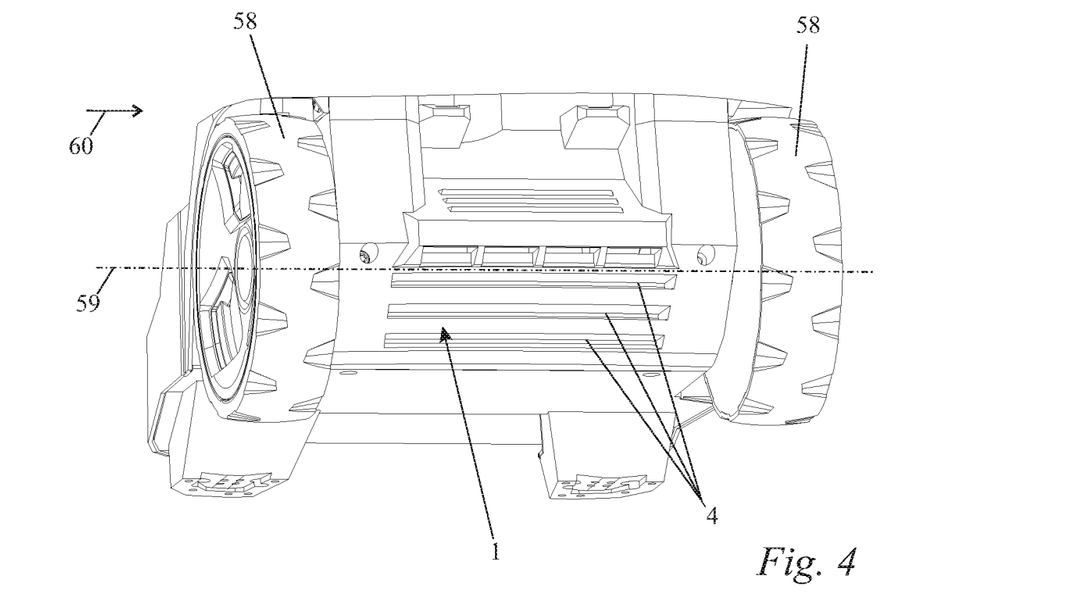
FIG. 4 is another perspective illustration of a portion of the high pressure washer according to FIG. 1.

As illustrated in FIGS. 3 and 4, the venting device 1 comprises a plurality of venting slots 4. In the embodiment, the venting device 1 comprises three venting slots 4. The venting slot 4 extends in the operating position 40 of the venting device 1 along a longitudinal direction 60. In the embodiment, the longitudinal direction 60 extends in the direction of the rotation axis 59 of the wheels 58.

Figure 5:
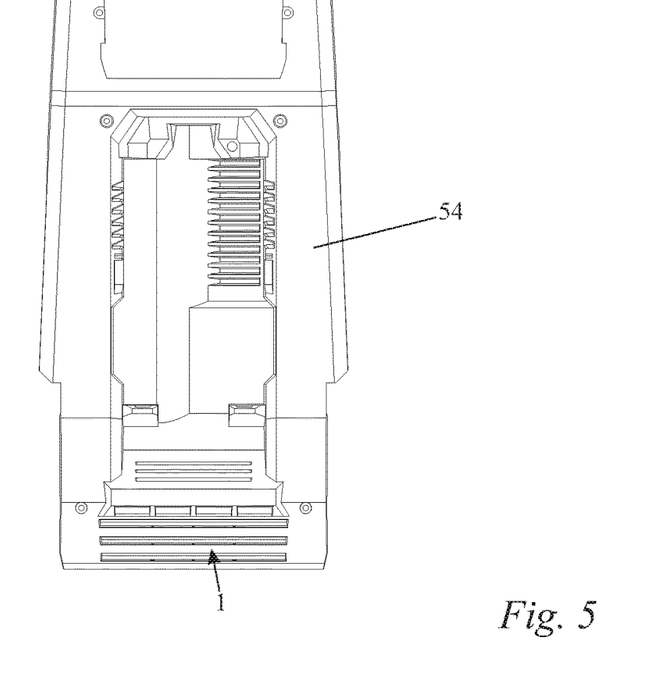
FIG. 5 is a side view of the housing of the high-pressure washer according to FIG. 1.
Figure 6:
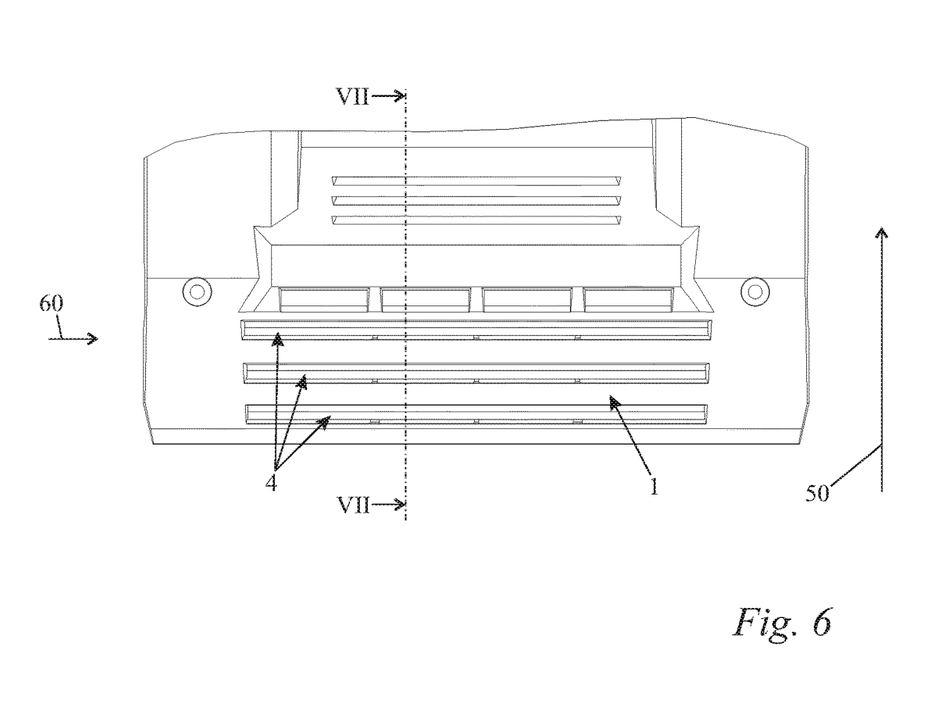
FIG. 6 is a detail of the side view of FIG. 5.

FIG. 5 shows the housing 54 of the power tool 51 in a side view in a viewing direction onto the venting device 1. FIG. 6 shows an enlarged illustration of a detail of FIG. 5. The venting slots 4 are positioned adjacent to each other. All venting slots 4 extend in longitudinal direction 60. The venting slots 4 extend parallel to each other. In the operating position 40, the venting slots 4 extend transversely, in the embodiment perpendicularly, to the vertical direction 50. The venting slots 4 are positioned adjacent to each other in the vertical direction 50. The vertical direction 50 is positioned perpendicularly relative to the flat ground 7.

Figure 7:
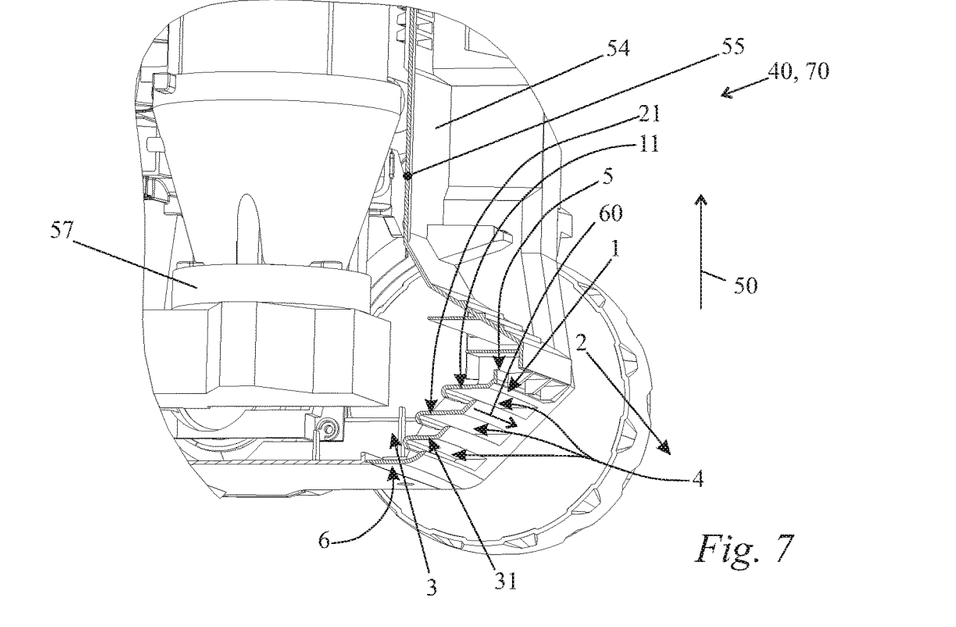
FIG. 7 is a three-dimensional illustration of a section along the section plane that is indicated by VII-VII in FIG. 6.
Figure 8:
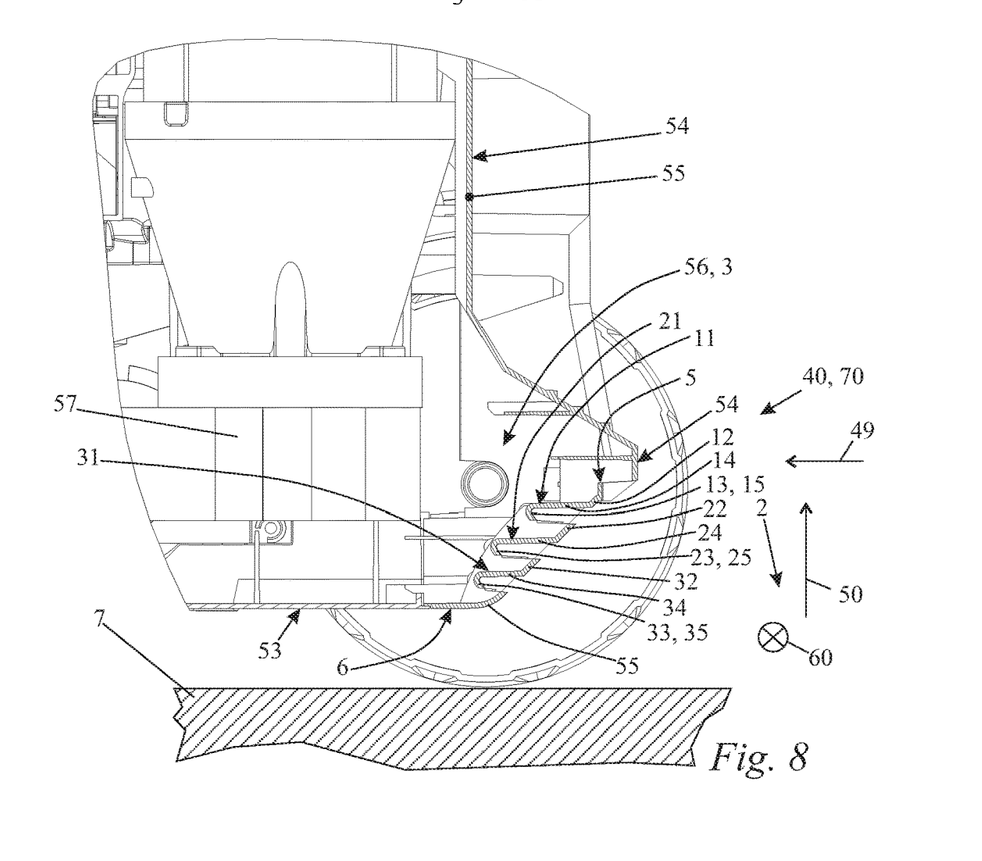
FIG. 8 is a side view of the section along the section plane that is indicated in FIG. 6 by VII-VII.

The section illustrations of FIGS. 7 and 8 show that the housing 54 of the power tool 51 comprises a housing wall 55. The venting device 1 is part of the housing wall 55. The venting device 1 comprises an interior 3 and an exterior 2. At the interior 3 of the venting device 1, the housing interior 56 of the housing 54 is arranged. The exterior 2 of the venting device 1 is positioned outside of the housing 54.

The power tool 51 comprises at least one electrically operated component 57. In the embodiment, the at least one electrically operated component is a pump. The pump generates the required pressure for the cleaning liquid that is to be sprayed by the high-pressure washer. The venting device 1 in the position of use 70 is at least partially arranged below all electrically operated components 57. The lowest point of the venting device 1 is positioned below all electrically operated components 57. In this way, it is prevented that splash water penetrating through the venting slots 4 of the venting device 1 can drip from above onto electrically operated components 57. For cooling the at least one electrically operated component 57, the power tool 51 sucks in air from the exterior 2 through the venting device 1 to the interior 3 of the venting device 1.

As illustrated in FIG. 7, the venting device 1 comprises a plurality of adjacently arranged slats 11, 21, 31. The slats 11, 21, 31 are components of the housing wall 55 of the power tool 51. The venting device 1, in particular the slats 11, 21, 31, are made of plastic material. The housing 54 of the power tool 51 is comprised of plastic material. The venting device 1 comprises the first slat 11. The venting device 1 comprises the second slat 21. The venting device 1 comprises the third slat 31. Each of the slats 11, 21, 31 comprises a front section 12, 22, 32 at the exterior 2 of the venting device 1. The first slat 11 comprises the first front section 12. The second slat 21 comprises the second front section 22. The third slat 31 comprises the third front section 32. The venting slots 4 are formed between the front sections 12, 22, 32.

The slats 11, 21, 31 comprise a deflection section 13, 23, 33 at the interior 3. The first slat 11 comprises the first deflection section 13. The second slat 21 comprises the second deflection section 23. The third slat 31 comprises the third deflection section 33. The deflection section 13, 23, 33 is connected by a central section 14, 24, 34 of the slat 11, 21, 31 to the front section 12, 22, 32. The first slat 11 comprises the first central section 14. The second slat comprises the second central section 24. The third slat comprises the third central section 34. The front section 12, 22, 32 is angled relative to the central section 14, 24, 34. In this context, "angled" does not necessarily mean that an edge is formed between the front section and the central section. The term "angled" is to be understood such that a contact plane can be positioned at the front section from the exterior, and that a contact plane can be positioned at the central section, also from the exterior, and that the two contact planes are positioned at a slant relative to each other. The front section 12, 22, 32 in the embodiment is angled relative to the central section 14, 24, 34 in that the front section 12, 22, 32 passes by a rounded or curved shape into the central section 14, 24, 25.

The deflection section 13, 23, 33 is angled relative to the central section 14, 24, 34. The meaning of the term "angled" in this context is to be understood analog to the use of this term in connection with the front section and the central section.

The slat 11, 21, 31 comprises the front section 12, 22, 32, the deflection section 13, 23, 33, and the central section 14, 24, 34.

The venting device 1 comprises, as illustrated in FIG. 8, the operating position 40. When the venting device 1 is in the operating position 40, the power tool 51 is in the position of use 70. The surface of the ground 7 extends perpendicular to the vertical direction 50. In the operating position 40, the venting device 1 comprises, in respect to the vertical direction 50, a top side 5 and a bottom side 6. The top side 5 of the venting device 1 is facing the top end 52 of the power tool 51. The bottom side 6 of the venting device 1 is facing the bottom end 53 of the power tool 51.

In the operating position 40, the front section 12, 22, 32 extends from the central section 14, 24, 34 in the direction toward the top side 5 of the venting device 1. In the operating position 40 of the venting device 1, the front section 12, 22, 32 is angled away from the central section 14, 24, 34 in the direction toward the top side 5 of the venting device 1. In the operating position 40 of the venting device 1, the deflection section 13, 23, 33 extends from the central section 14, 24, 34 in the direction toward the bottom side 6. In the operating position 40 of the venting device 1, the deflection section 13, 23, 33 is angled away from the central section 14, 24, 34 in the direction toward the bottom side 6 of the venting device 1. Due to the plurality of adjacently arranged slats 11, 21 and 31, a splash guard is formed for at least partial diversion of splashing water penetrating from the exterior 2 of the venting device 1 in the direction toward the interior 3 of the venting device 1. As illustrated in FIG. 7, the slats 11, 21, 31 extend along the longitudinal direction 60. As can be seen in FIG. 8, the longitudinal direction 60 extends parallel to the surface of the ground 7.

The deflection section 13, 23, 33 overlaps at least partially a correlated venting slot 4 in the viewing direction 49 from the exterior 2 toward the interior 3. The viewing direction 49 is oriented perpendicularly to the longitudinal direction 60. The viewing direction 49 in the operating position 40 of the venting device 1 is perpendicular to the vertical direction 50. In the operating position 40 of the venting device 1, the viewing direction 49 extends parallel to the flat surface of the ground 7. The viewing direction corresponds to a demolding direction for removing the venting device 1 from the mold. In this context, one of two molds for the venting device 1 is removed in the direction of the demolding direction.

Figure 9:
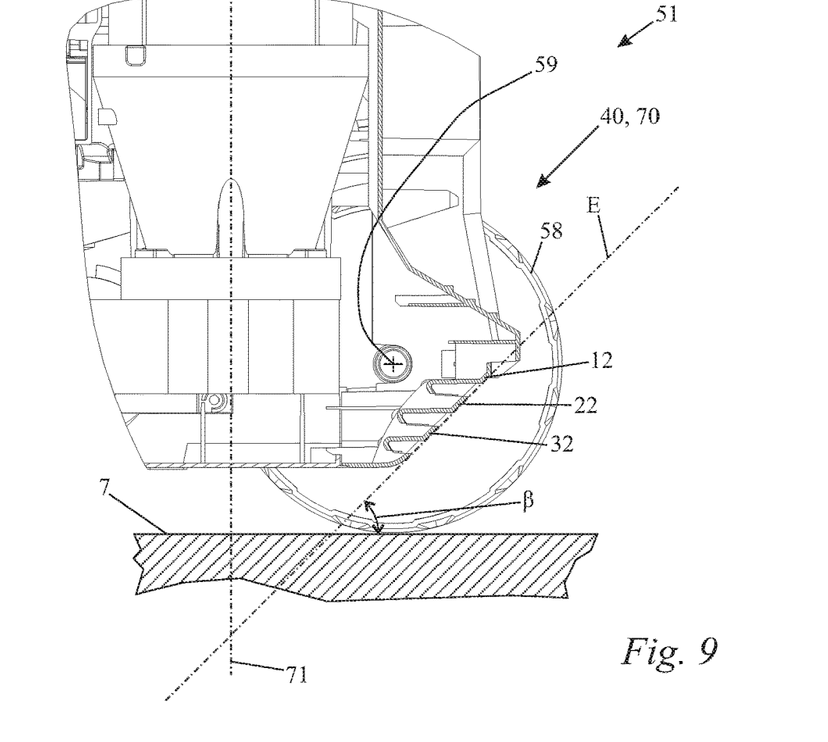
FIG. 9 is another side view of the section along the section plane identified in FIG. 6 by VII-VII.

As illustrated in FIG. 9, the front sections 12, 22, 32 are positioned in a common plane E. In the operating position 40 of the venting device 1, the common plane E is oriented at an angle β of 30° to 60° against the flat ground 7. Accordingly, the power tool 51 can be tilted about the rotation axis 59 of the wheels 58 from the position of use 70 into a pulling position. In the pulling position, the power tool 51 is supported only by means of the wheels 58 on the flat ground 7. In the pulling position, the power tool can be pulled along by means of the wheels 58. The power tool 51 has a longitudinal axis 71. The longitudinal axis 71 is oriented in the position of use 70 perpendicularly to the flat ground 7. In the pulling position, the longitudinal axis 71 of the power tool 51 is oriented at an angle of 20° to 70° to the flat ground 7. Due to the slanted orientation of the front sections 12, 22 and 32 in the position of use 70, the venting device 1, when tilting the power tool 51 into the pulling position, projects only minimally so that the venting device 1 does not contact the ground 7.

Figure 10:
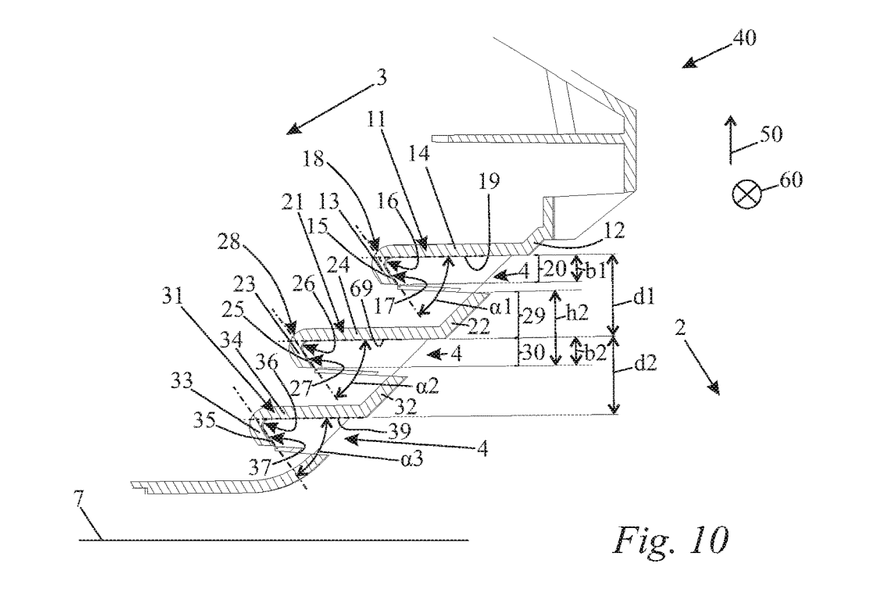
FIG. 10 is an enlarged illustration of a detail of the section illustration of FIG. 8 in the region of the venting device.

FIG. 10 shows a detail illustration of the venting device 1. The deflection section 13, 23, 33 comprises a region 15, 25, 35 which is oriented at an angle α1, α2, α3 of less than 90°, in the embodiment at an angle α1, α2, α3 of less than 60°, relative to the central section 14, 24, 34. The deflection section 13, 23, 33 is slanted toward the exterior of the venting device 1. The first deflection section 13 comprises the first region 15. The second deflection section 23 comprises the second region 25. The third deflection section 33 comprises the third region 35. The first region 15 is oriented at a first angle α1 of less than 90°, in the embodiment of less than 60°, relative to the first central section 14. The second region 25 is oriented at a second angle α2 of less than 90°, in the embodiment of less than 60°, relative to the second central section 24. The third region 35 is positioned at a third angle α3 of less than 90°, in the embodiment of less than 60°, relative to the third central section 34. The regions 15, 25, 35 extend in a plane which is illustrated by dash-dotted line.

The deflection section 13, 23, 33 comprises an outer surface 17, 27, 37. The first deflection section 13 comprises the first outer surface 17. The second deflection section 23 comprises the second outer surface 27. The third deflection section 33 comprises the third outer surface 37. The outer surface 17, 27, 37 is facing the exterior 2 of the venting device 1. The central section 14, 24, 34 comprises a surface 19, 69, 39. The surface 19, 69, 39 is facing the exterior 2 of the venting device 1. The first central section 14 comprises the first surface 19. The second central section 24 comprises the second surface 69. The third central section 34 comprises the third surface 39. The surface 19, 69, 39 is planar.

The region 15, 25, 35 of the deflection section 13, 23, 33 is at least a part of the outer surface 17, 27, 37 of the deflection section 13, 23, 33 which is facing the exterior 2. It can also be provided that the region is the entire outer surface of the deflection section which is facing the exterior. The angle α1, α2, α3 is measured between the outer surface 17, 27, 37 of the region 15, 25, 35 facing the exterior 2 and the surface 19, 69, 39 of the central section 14, 24, 34 facing the exterior 2.

As illustrated in FIG. 10, the second surface 69 of the second central section 24 of the second slat 21 comprises a first distance d1 relative to the first surface 19 of the first central section 14 of the first slat 11. The first distance d1 is measured in the operating position 40 of the venting device 1 in the direction perpendicular to the surface of the ground 7. The first distance d1 is measured in the operating position 40 of the venting device 1 in the direction of the vertical direction 50.

The third surface 39 of the third central section 34 of the third slat 31 comprises a second distance d2 relative the second surface 69 of the second central section 24 of the second slat 21. The second distance d2 is measured in the operating position 40 of the venting device 1 in the direction perpendicular to the surface of the ground 7. The second distance d2 is measured in the operating position 40 of the venting device 1 in the direction of the vertical direction 50.

The deflection section 13, 23 extends in the operating position 40 relative to the vertical direction 50 across a deflection region 20, 30. The first deflection section 13 extends across the first deflection region 20. The second deflection section 23 extends across the second deflection region 30. The deflection section 13, 23 extends, beginning at the surface 19, 69 of the central section 14, 24 facing the exterior 2, in the direction toward the bottom side 6 of the venting device 1. A deflection height b1, b2 of the deflection region 20, 30 which is measured in vertical direction 50 in the operating position 40 amounts to at least 20%, in the embodiment at least 30%, of the distance d1, d2. The first deflection section 13 comprises the first deflection height b1. The second deflection section 23 comprises the second deflection height b2. The first deflection height b1 amounts to at least 20%, in the embodiment at least 30%, of the first distance d1. The second deflection height b2 amounts to at least 20%, in the embodiment at least 30%, of the second distance d2.

The region 15, 25 of the deflection section 13, 23 extends in the operating position 40 of the venting device 1 in vertical direction 50 across at least 50%, in the embodiment across at least 60%, of the deflection region 20, 30. The first region 15 of the first deflection section 13 extends across at least 50%, in the embodiment across at least 60%, of the first deflection region 20. The second region 25 of the second deflection section 23 extends across at least 50%, in the embodiment across at least 60%, of the second deflection region 30. The first region 15 of the first deflection section 13 extends in vertical direction 50 across at least 10%, in the embodiment across at least 15%, of the first distance d1. The second region 25 of the second deflection section 23 extends in vertical direction 50 across at least 10%, in the embodiment across at least 15% of the second distance d2.

The central section 14, 24, 34 and the deflection section 13, 23, 33 comprise a common surface 16, 26, 36 which is facing the exterior 2 of the venting device 1. The first central section 14 and the first deflection section 13 comprise the first common surface 16. The second central section 24 and the second deflection section 23 comprise the second common surface 26. The third deflection section 34 and the third deflection section 33 comprise the third common surface 36. The common surface 16, 26, 36 is concave in cross section perpendicular to the longitudinal direction 60. The at least one slat 11, 21, 31 extends along the longitudinal direction 60. In cross section perpendicular to the longitudinal direction 60 of the at least one slat 11, 21, 31, the common surface 16, 26, 36 follows in sections thereof a circular arc line. The common surface 16, 26, 36 of the deflection section 13, 23, 33 and of the central section 14, 24, 34 is formed by the outer surface 17, 27, 37 of the deflection section 13, 23, 33 and the surface 19, 69, 39 of the central section 14, 24, 34.

The central section 14, 24, 34 of the slat 11, 21, 31 extends in the operating position 40 of the venting device 1 transverse to the vertical direction 50, in the embodiment perpendicular to the vertical direction 50. A plurality of slats 11, 21, 31 with a central section 14, 24, 34 and a deflection section 13, 23, 33 are provided. At least one deflection section 13, 23 is formed and arranged such that in the operating position 40 of the venting device 1 water can drip from the outer surface 17, 27 of the deflection section 13, 23 which is facing the exterior 2 of the venting device 1 onto the central section 24, 34 of a neighboring slat 21, 31. In the operating portion 40, water from the first outer surface 17 of the first deflection section 13 can drip onto the second center section 24 of the neighboring second slat 21. In the operating position 40, water from the second outer surface 27 of the second deflection section 23 can drip onto the third central section 34 of the neighboring third slat 31.

Figure 11:
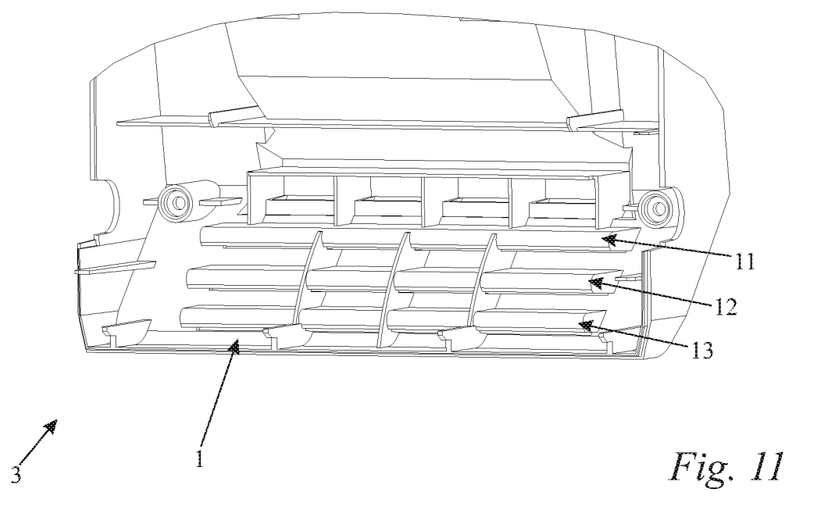
FIG. 11 is a perspective view of an interior of the venting device according to FIG. 10.

The plurality of slats 11, 21, 31 are arranged in a stair-like arrangement. In the direction perpendicular to a plane which is defined by the vertical direction 50 and the longitudinal direction 60, the first slat 11, the second slat 21, and the third slat 31 are displaced relative to each other; this can be seen also in FIG. 11.

As illustrated in FIG. 10, the at least one deflection section 13, 23 is shaped at the interior 3 such that in the operating position 40 of the venting device 1 water can drip from an inner surface 18, 28 of the deflection section 13, 23 facing the interior 3 onto the neighboring slat 21, 31. The first deflection section 13 is shaped at the interior 3 such that water from the first inner surface 18 of the first deflection section 13 can drip onto the neighboring second slat 21. The second deflection section 23 is formed at the interior 3 such that water from the second inner surface 28 of the second deflection section 23 can drip onto the neighboring third slat 31.

In the operating position 40 of the venting device 1, the central sections 14, 24, 34 of the plurality of slats 11, 21, 31 are positioned in vertical direction 50 at least in sections thereof adjacent to each other, in the embodiment parallel to each other in sections thereof. The first slat 11 is positioned in sections thereof parallel adjacent to the second slat 21. The second slat 21 is positioned in sections thereof parallel adjacent to the third slat 31. The plurality of slats 21, 31 have the same shape. The second slat 21 and the third slat 31 have the same shape.

The plurality of slats 11, 21, 31 comprise the first slat 11 and the second slat 21. At least the second front section 22 of the second slat 21 extends across a second front region 29 of at least 30%, in the embodiment of at least 50%, of the first distance d1.

The plurality of slats 11, 21, 31 comprise the third slat 31. The second deflection region 30 extends across at least 30% of the second distance d2.

The second slat 21 comprises a height h2 measured in the operating position 40 in vertical direction 50. The second front region 29 extends in vertical direction 50 in the operating position 40 across at least 40%, in the embodiment across at least 50%, of the second height h2 of the second slat 21. The second deflection region 30 of the second deflection section 23 of the second slat 21 extends in the operating position 40 of the venting device 1 in vertical direction 50 across at least 20%, in the embodiment across at least 30%, of the second height h2 of the second slat 21. The region 25 of the second deflection section 23 extends in vertical direction 50 across at least 15%, in the embodiment at least 20%, of the second height h2 of the second slat 21.

The specification incorporates by reference the entire disclosure of European priority document 19 205 170.4 having a filing date of Oct. 24, 2019.

While specific embodiments of the invention have been shown and described in detail to illustrate the inventive principles, it will be understood that the invention may be embodied otherwise without departing from such principles.

What is claimed is:

1. A power tool comprising:
a venting device with a splash guard for at least partial deflection of splashing water advancing from an exterior of the power tool in a direction toward an interior of the power tool, wherein the power tool is configured to suck in air through the venting device from the exterior to the interior of the power tool, wherein the power tool comprises a position of use and wherein the power tool comprises a top end and a bottom end, relative to a vertical direction, in the position of use;
wherein the venting device comprises:

slats, each comprising a front section arranged at the exterior of the power tool, wherein venting slots are formed between the front sections;
wherein at least one of the slats comprises a deflection section arranged at the interior of the power tool and further comprises a central section, wherein the deflection section is connected by the central section to the front section, wherein the front section is angled relative to the central section, and wherein the deflection section is angled relative to the central section;
wherein the front section of said at least one slat in the position of use of the power tool extends from the central section in a direction toward the top end of the power tool;
wherein the deflection section of said at least one slat in the position of use of the power tool extends from the central section in a direction toward the bottom end of the power tool, and wherein the deflection section comprises a region that is oriented at an angle of less than 90° relative to the central section.

2. The power tool according to claim 1, wherein the region of the deflection section and the central section are positioned at an angle of less than 60° relative to each other.

3. The power tool according to claim 1, wherein the deflection section at least partially overlaps a correlated venting slot in a viewing direction from the exterior to the interior of the power tool.

4. The power tool according to claim 1, wherein the central section and the deflection section comprise a common surface, wherein the common surface is facing the exterior of the power tool, and wherein the common surface has a concave cross-sectional shape when viewed in a cross section perpendicular to a longitudinal direction of said at least one slat.

5. The power tool according to claim 4, wherein the concave cross-sectional shape of the common surface follows a circular arc line.

6. The power tool according to claim 1, wherein the central section in the position of use of the power tool extends transversely or perpendicularly to the vertical direction.

7. The power tool according to claim 1, wherein said at least one slat is a plurality of slats, each provided with the deflection section and the central section.

8. The power tool according to claim 7, wherein at least one of the deflection sections comprises an outer surface facing the exterior of the power tool and is shaped and arranged such that, in the position of use of the power tool, water can drip from the outer surface onto the central section of the neighboring slat.

9. The power tool according to claim 7, wherein the plurality of slats are arranged in a stair arrangement.

10. The power tool according to claim 7, wherein at least one of the deflection sections comprises an inner surface facing the interior of the power tool and is shaped such that in the position of use of the power tool water can drip from the inner surface onto the neighboring slat.

11. The power tool according to claim 7, wherein the central sections of the plurality of slats in the position of use of the power tool are arranged adjacent to each other at least in sections thereof in the vertical direction.

12. The power tool according to claim 11, wherein the central sections are arranged parallel adjacent to each other at least in sections thereof.

13. The power tool according to claim 11, wherein the plurality of slats include a first slat and a second slat, wherein the central section of the first slat comprises a first surface facing the exterior of the power tool and wherein the central section of the second slat comprises a second surface facing the exterior of the power tool, wherein the second surface is spaced apart at a first distance from the first surface, and wherein at least the front section of the second slat extends across a front region amounting to at least 30% of the first distance.

14. The power tool according to claim 13, wherein the plurality of slats include a third slat, wherein the central section of the third slat comprises a third surface facing the exterior of the power tool, wherein the second surface comprises a second distance relative to the third surface, and wherein at least the deflection section of the second slat extends across a deflection region amounting to at least 30% of the second distance.

15. The power tool according to claim 7, wherein the plurality of slats have the same shape.

16. A power tool comprising:
- a venting device with a splash guard for at least partial deflection of splashing water advancing from an exterior of the venting device in a direction toward an interior of the venting device, the venting device comprising:
  - slats, each comprising a front section arranged at the exterior, wherein venting slots are formed between the front sections;
  - wherein at least one of the slats comprises a deflection section arranged at the interior and further comprises a central section, wherein the deflection section is connected by the central section to the front section, wherein the front section is angled relative to the central section, and wherein the deflection section is angled relative to the central section;
  - wherein the venting device comprises an operating position and the venting device comprises a top side and a bottom side, relative to a vertical direction, in the operating position;
  - wherein the front section of said at least one slat in the operating position extends from the central section in a direction toward the top side;
  - wherein the deflection section of said at least one slat in the operating position extends from the central section in a direction toward the bottom side and wherein the deflection section comprises a region that is oriented at an angle of less than 90° relative to the central section;
- wherein the power tool is configured to be positioned in a position of use on a flat ground;
- wherein the venting device is in an operating position when the power tool is in the position of use;
- wherein the power tool further comprises a housing with a housing wall, wherein the venting device is part of the housing wall, wherein the housing interior of the housing is arranged at the interior of the venting device, wherein the exterior of the venting device is positioned outside of the housing, and wherein the power tool is configured to suck in air through the venting device from the exterior to the interior.

17. The power tool according to claim 16, wherein the power tool, relative to the flat ground, comprises a top end and a bottom end, wherein the venting device is arranged at the bottom end of the power tool.

18. The power tool according to claim 16, wherein the power tool is a high-pressure washer.

19. A power tool comprising:
- a venting device with a splash guard for at least partial deflection of splashing water advancing from an exterior of the venting device in a direction toward an interior of the venting device, the venting device comprising:
  - slats, each comprising a front section arranged at the exterior, wherein venting slots are formed between the front sections;
  - wherein at least one of the slats comprises a deflection section arranged at the interior and further comprises a central section, wherein the deflection section is connected by the central section to the front section, wherein the front section is angled relative to the central section, and wherein the deflection section is angled relative to the central section;
  - wherein the venting device comprises an operating position and the venting device comprises a top side and a bottom side, relative to a vertical direction, in the operating position;
  - wherein the front section of said at least one slat in the operating position extends from the central section in a direction toward the top side;
  - wherein the deflection section of said at least one slat in the operating position extends from the central section in a direction toward the bottom side and wherein the deflection section comprises a region that is oriented at an angle of less than 90° relative to the central section;
- wherein the power tool is configured to be positioned in a position of use on a flat ground;
- wherein the venting device is in an operating position when the power tool is in the position of use;
- wherein the power tool further comprises at least one electrically operated component, wherein the venting device in the position of use of the power tool is arranged at least partially below all of the at least one electrically operated component.

* * * * *